United States Patent [19]

Beckham et al.

[11] Patent Number: 4,604,644
[45] Date of Patent: Aug. 5, 1986

[54] SOLDER INTERCONNECTION STRUCTURE FOR JOINING SEMICONDUCTOR DEVICES TO SUBSTRATES THAT HAVE IMPROVED FATIGUE LIFE, AND PROCESS FOR MAKING

[75] Inventors: Keith F. Beckham, Newburgh; Anne E. Kolman, Wappingers Falls; Kathleen M. McGuire, Fishkill; Karl J. Puttlitz, Wappingers Falls; Horatio Quinones, Peekskill, all of N.Y.

[73] Assignee: International Business Machines Corporation, Armonk, N.Y.

[21] Appl. No.: 695,597

[22] Filed: Jan. 28, 1985

[51] Int. Cl.[4] .................... H01L 23/50; H01L 21/58; H05K 7/06; H05K 3/34
[52] U.S. Cl. ........................................ 357/80; 357/67; 357/68; 357/69; 357/72; 29/590; 29/840; 228/175; 228/180.2; 361/400
[58] Field of Search ............ 357/69, 80, 67, 72, 357/65, 68; 361/400; 29/840, 588, 590; 228/175, 180.2, 214

[56] References Cited

U.S. PATENT DOCUMENTS

| 3,871,015 | 3/1975 | Lin et al. | 357/65 |
| 4,190,855 | 2/1980 | Inoue | 357/72 |
| 4,238,528 | 12/1980 | Angelo et al. | 228/214 |
| 4,545,610 | 10/1985 | Lakritz et al. | 357/68 |

FOREIGN PATENT DOCUMENTS

| 52-39556 | 3/1977 | Japan | 228/214 |
| 55-62777 | 5/1980 | Japan | 357/72 |
| 58-134449 | 8/1983 | Japan | 357/72 |

OTHER PUBLICATIONS

Martin et al., IBM Technical Disclosure Bulletin vol. 23, No. 5, Oct. 1980, pp. 1877-1878.

Primary Examiner—William D. Larkins
Assistant Examiner—John Lamont
Attorney, Agent, or Firm—Wolmar J. Stoffel

[57] ABSTRACT

An improved solder interconnection for forming I/O connections between an integrated semiconductor device and a support substrate having a plurality of solder connections arranged in an area array joining a set of I/O's on a flat surface of the semiconductor device to a corresponding set of solder wettable pads on a substrate, the improvement being a band of dielectric organic material disposed between and bonded to the device and substrate embedding at least an outer row of solder connections leaving the center inner solder connections and the adjacent top and bottom surfaces free of dielectric material.

15 Claims, 9 Drawing Figures

SOLDER INTERCONNECTION STRUCTURE FOR JOINING SEMICONDUCTOR DEVICES TO SUBSTRATES THAT HAVE IMPROVED FATIGUE LIFE, AND PROCESS FOR MAKING

TECHNICAL FIELD

This invention relates to interconnection structures for joining a microminiaturized component to a supporting board or substrate and more particularly to a structure for forming solder interconnection joints that have improved fatigue life, and a method of making such interconnection structure.

The present invention involves the face down or flip chip bonding of a semiconductor device to a substrate wherein a plurality of electrical interconnections between the device and the supporting board or substrate are formed by very small and closely spaced solder interconnections.

The present invention is an improvement in solder reflow controlled collapse chip connection (C-4) technology. U.S. Pat. Nos. 3,401,126 and 3,429,040 to Louis F. Miller and assigned to the assignee of the present patent application describes in detail the controlled collapse chip connection (C-4) technique of face down bonding of semiconductor chips to a carrier. In general, what is described and claimed in these patents is the formation of a malleable pad of metallic solder on the semiconductor device contact site and solder joinable sites on the conductors on the chip carrier. The device carrier solder joinable sites are surrounded by non-solderable barriers so that when the solder on the semiconductor device contact sites melts, surface tension holds the semiconductor device suspended above the carrier. With the development of the integrated circuit semiconductor device technology, the size of individual active and passive elements have become very small, and the number of elements in the device has increased dramatically. This results in significantly larger device sizes with larger numbers of I/O terminals. This trend will continue and will place increasingly higher demands on device forming technology. An advantage of solder joining a device to a substrate is that the I/O terminals can be distributed over substantially the entire top surface of the semiconductor device. This allows an efficient use of the entire surface, which is more commonly known as area bonding.

Usually the integrated circuit semiconductor devices are mounted on supporting substrates made of materials with coefficients of expansion that differ from the coefficient of expansion of the material of the semiconductor device, i.e. silicon. Normally the device is formed of monocrystalline silicon with a coefficient of expansion of $2.5 \times 10^{-6}$ per °C. and the substrate is formed of a ceramic material, typically alumina with a coefficient of expansion of $5.8 \times 10^{-6}$ per °C. In operation, the active and passive elements of the integrated semiconductor device inevitably generate heat resulting in temperature fluctuations in both the devices and the supporting substrate since the heat is conducted through the solder bonds. The devices and the substrate thus expand and contract in different amounts with temperature fluctuations, due to the different coefficients of expansion. This imposes stresses on the relatively rigid solder terminals. The stress on the solder bonds during operation is directly proportional to (1) the magnitude of the temperature fluctuations, (2) the distance of an individual bond from the neutral or central point (DNP), and (3) the difference in the coefficients of expansion of the material of the semiconductor device and the substrate, and inversely proportional to the height of the solder bond, that is the spacing between the device and the support substrate. The seriousness of the situation is further compounded by the fact that as the solder terminals become smaller in diameter in order to accommodate the need for greater density, the overall height decreases.

In order to accommodate for future larger device sizes, which increases the distance from the outer solder joints from the neutral point, which in turn reduces the fatigue life of the solder bond, new innovations are needed to solve this pressing need.

DISCLOSURE OF THE INVENTION

An object of this invention is to provide an improved solder interconnection structure for joining electrical devices, which interconnection structure has increased fatigue life.

Another object of this invention is to provide a method for increasing the fatigue life of solder connections between a semiconductor device and a supporting substrate.

The improved solder interconnection structure for electrically joining a semiconductor device to a support substrate of the invention that has a plurality of solder connections arranged in columns and rows where each solder connection is joined to a solder wettable pad on the device and a corresponding solder wettable pad on the support substrate, an organic polymerized resin material disposed between the peripheral area of the device and the facing area of the substrate, which material surrounds at least one outer row and column of solder connections but leaves the solder connections in the central area of the device free of resin material.

The improved method of the invention for increasing the fatigue life of the solder connection between the semiconductor device and the multilayer ceramic substrate involves of applying an overcoat material exclusively to the peripheral solder connections between the semiconductor device and a ceramic substrate wherein the inner solder connections are left uncoated.

BRIEF DESCRIPTION OF THE DRAWINGS

The details of our invention will be described in connection with the accompanying drawings in which.

Figure 1:
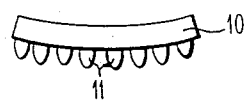
FIG. 1 is a sectioned elevational view through the center of an integrated semiconductor device illustrating the profile in exaggerated scale, at room temperature.

In order to better appreciate the interconnection structure and process of our invention it will be useful to explore the theory underlying the invention. As is well known in the art, an integrated circuit semiconductor device is a relatively complex laminated structure made up of a number of different materials having different physical characteristics. The device typically has a base substrate of monocrystalline silicon with a plurality of layers of $SiO_2$, and/or $Si_3N_4$, or other dielectric layers or combinations thereof bonded to one side with a network of aluminum metallurgy stripes sandwiched between the layers. Further, in dielectric isolation applications there may be $SiO_2$-filled trenches provided on one side of the substrate. The end result is basically a laminated structure with a thin bonded skin of material on one side that has a different coefficient of expansion from the basic substrate material, i.e. silicon. We have discovered that this complex structure assumes a bowed configuration at room temperature that has a concave surface when viewed from the back or top side opposite the side containing the devices. This configuration results when a device is cooled down after the layers have been deposited at relatively high temperatures. The structure is somewhat analogous to a bi-metallic strip of metal. The shape of the device at room temperature in an unconstrained condition is illustrated in FIG. 1 which shows the curvature of device 10 greatly exaggerated.

The surface 11 is the surface that contains the aforedescribed plurality of dielectric layers and aluminum metallurgy stripes sandwiched therebetween.

When the device 10 is connected to a substrate 12 by solder bonding terminals 13 in a manner well known in the art as described in U.S. Pat. Nos. 3,401,126 and 3,429,040, and the substrate is of a material with a coefficient of expansion greater than the coefficient of expansion of silicon, the device 10 assumes the shape shown in FIG. 2. Again, the shape is greatly exaggerated for illustrative purposes. In general, the shape of the joined device 10 is changed from the shape shown in FIG. 1 in a free state. The device 10 may appear convex as illustrated in FIG. 2 or be planar or possibly even concave, but less concave than in the unconstrained relaxed condition. In general, when a joined chip is removed from a substrate, it is found to be more concave than it was in the joined state, as viewed from the unbonded side of the chip. There are two mechanisms, both of which cause a joined chip to be held in a more convex shape than its free-state shape. Based on calculations, we believe that the primary mechanism to be the differential expansion between the silicon chip and the substrate to which it is joined, the substrate having the larger coefficient of thermal expansion than the chip. As both chip and substrate cool from the chip joining temperature which is equal or exceeding the melting point of the lead used to form the interconnection 13, the substrate will contract more than the chip and exert inwardly directed forces on the underside of the chip which tend to make it more convex as shown in FIG. 2. This imposes a shear strain on the C-4 terminals, which is greatest at the large distance from the neutral point.

The nominal shear strain $\Delta\epsilon$ is given by $$\Delta\epsilon = -1/h \, (DNP) \, (\Delta T)(\Delta a - c)$$

where h is the height of the C-4 terminals, DNP is the distance from the neutral point, $\Delta T$ is the change in temperature, and $\Delta a - c$ is the difference in the coefficients of expansion of the materials of the substrate and the chip. Shear stress, as indicated, is a linear relationship that increases from zero as the point of calculation progresses away from the neutral point. The other mechanism is differential expansion between the silicon chip substrate and the aluminum and quartz layer deposited on the bottom side of the chip substrate, i.e. on the side 11 as illustrated in FIG. 1. The dielectric layers are, in general, high temperature processes, where both the substrate and the layers are at elevated temperatures. At these temperatures the chip surface is essentially planar. When the chip is cooled down to room temperature stresses are generated by the unequal coefficients of expansion of the materials which result in the bowed shape illustrated in FIG. 1. When the chip 10 is joined to substrate 12, the assembly is heated to melt the solder terminals 13. This heating removes some of the bowed shape from the chip 10, but not all since the chip joining temperature is well below the dielectric layer deposition process. As the chip and substrate are cooled the C-4 terminals 13 freeze and attempt to hold the chip at the shape at the solder melting point. As the chip cools from the joining temperature, the net motion of the chip, if free, would be to assume a concave shape shown in FIG. 1. However, it is kept from doing so by the C-4 solder bonds.

The joined chip 10 is held in a more convex shape than its free shape, as contrasted in FIGS. 1 and 2. It follows that the outer terminals must therefore be in axial tension.

Since the total forces are in balance, it follows that some of the inner C-4 terminals are in compression. The overall axial displacement of the C-4 terminals is depicted in FIG. 2 where the vertical axis 15 corresponds to the center or neutral point of the device, and the horizontal axis 16 indicates 0 displacement. Note that the portion 20 of curve 18 indicates that the C-4 terminals about the neutral point, which are in compression, are shortened. In contrast, portion 22 of curve 18 indicates an elongation of the C-4 terminals displaced outwardly of the neutral point. Note also that the curve 18 is curved upwardly, as in a parabola, indicating that the relationship depicted is not linear. Since the shear stress is linear, and curve 18 depicts the total stress from shear and stress imposed by the bowed device configuration, it is apparent that the stress imposed by bowed device configuration is non-linear. This displacement has adverse effects on the life of the outermost terminals under a repeated temperature fluctuation. The tensile stress is superimposed on the cyclic shear and thereby causes more fatigue deterioration. For another, fatigue cracks in the solder bonds which might otherwise remain narrow are opened up by the tensile stress and become less likely to conduct current. This invention involves the recognition of the aforedescribed phenomena and a structure and process for forming a structure for enabling a semiconductor device as joined to more effectively resist the forces tending to place the outer solder bond in tension. This invention consists of forming an adherent band of dielectric material about the outer periphery of the terminals thereby embedding one or more rows leaving the interior disposed solder terminals free of material. The structure of the invention is shown basically in FIG. 4 of the drawing.

Figure 2A:
FIG. 2A is a sectioned elevational view through the center of an integrated semiconductor device mounted on a substrate and joined by solder terminals, that illustrates in exaggerated scale, the change in profile.
Figure 2B:
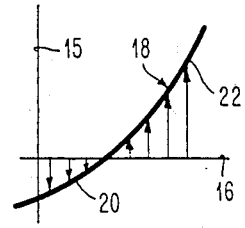
FIG. 2B is a plot of total nominal strain (normal and shear) of solder terminals vs. distance from the neutral point of the device depicted in FIG. 2A.
Figure 3A:
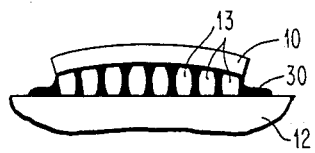
FIG. 3A is a sectioned elevational view of a device mounted on a substrate, similar to FIG. 2A, except that a dielectric material has been deposited about all of the solder terminals of the device.
Figure 3B:
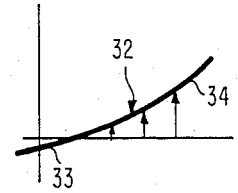
FIG. 3B is a plot of total nominal strain (normal and shear) of solder terminals vs. distance from the center or neutral point similar to FIG. 2B, but applied to the structure of FIG. 3A.

Referring now to FIG. 3A of the drawings, there is depicted a device 10 mounted on substrate 12 of a material having a coefficient of expansion different from the coefficient of expansion of the silicon of device 10, with all of solder terminals 13 embedded in a dielectric material 30. Note that device 10 is shown bowed upwardly as in FIG. 2A for the same reasons explained previously. Completely embedding the solder terminals 30 of a device is known in the prior art and practiced primarily for providing an alpha barrier shield for the device, usually a memory device, to protect the device from alpha particles emitted from the ceramic material which normally undergoes a slow radioactive decay. Material 30, normally an organic polymerized resin completely permeates the C-4 solder terminal which is necessary to provide an effective alpha barrier shield. Depending on the organic resin material 30, a bond is formed between the lower surface of semiconductor device 10 and the upper surface of substrate 12. This structure was investigated during the course of conceiving and reducing the invention of this application to practice. Curve 32 in FIG. 3B depicts the axial displacement in either compression or elongation of the solder terminals 13 during thermal cycling. The ordinant of the plot corresponds to the center or the neutral point of the device 10. When the device and substrate is thermal cycled, as occurs during normal operation, the solder terminals 13 are subjected to shear stress due to difference in coefficients of expansion of the materials of device 10 and substrate 12, and also the bowing action of the device 10 as explained previously in FIGS. 1 and 2. The dielectric material 30 being adherent to both the device and the substrate resists the forces along the periphery of the device that tend to stretch or elongate the solder terminal 13. Likewise, in the center of the device, the dielectric material 30 resists the compressing forces that tend to compress or shorten the solder terminal 13. As shown in FIG. 3B, a portion of curve 33 indicates that the solder terminals at the center are compressed or shortened while the curve above the horizontal ordinance 34 indicates that the solder terminals 13 are elongated. Comparing portions of curve 33 with 20 the compression is much less in the center due to the action of the dielectric material 30. The other mechanism is differential expansion between the silicon chips and the aluminum and quartz layer deposited on the bottom sides of the chip, i.e., on side 11 as illustrated in FIG. 1. As the chip cools from the joining temperature, the net motion of the chip, if free, would be to assume a concave shape. However, it is kept from doing so by the solder bond.

Figure 4A:
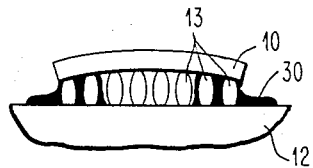
FIG. 4A is a sectioned elevational view of a device mounted on a substrate, similar to FIG. 3A, except that no dielectric material is present in the central area, illustrating the structure of the invention.
Figure 4B:
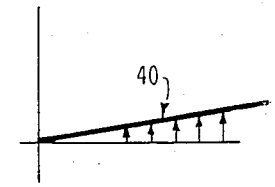
FIG. 4B is a plot of total nominal strain (normal (which=0)+shear) compression of solder terminals vs. distance from the center or neutral point applied to the structure of FIG. 4A.

Turning now to FIG. 4A there is depicted a device 10 mounted on substrate 12 and joined by solder terminals 13 wherein the peripheral area of the device has a mass of dielectric material 30 surrounding the peripheral solder terminals 13. Note particularly that the solder terminals 13 in the center portion of the device are not embedded. This structure depicts the subject matter of this invention. The plot in FIG. 4B which is a plot similar to the plots in 2B and 3B indicate the axial displacement of the solder terminals 13 in the structure depicted in FIG. 4A. Note that the axial displacement is less than in FIG. 3B, and that the curve 40 is straight indicating a linear relationship between the distance from the neutral point and the displacement. Quite unexpectedly and unpredictably the structure shown in 4A where dielectric material 13 is not present at the center area of the device, the ability of the solder terminals 13 to resist fatigue failure was increased four times the fatigue resisting ability of the structure shown in FIG. 2A. It is believed that the linear relationship, evident by curve 40, indicates that the total nominal strain of the C-4 terminals 13 is now limited primarily to shear developed by different coefficients of expansion of the materials of the device and the substrates, and that the bowing tendency of the device as a contribution to fatigue failure has been eliminated. It is theorized that the peripheral dielectric material 13 assists the solder terminals 13 to resist the tendency of the device 10 to pull away from substrate 12. This same action is present the structure of FIG. 3A which is part of the prior art. The presence of the dielectric material 30 on the outer terminals of the device of FIG. 4A reduces the amount they are elongated, and at the same time the compression of the terminals in the center portion of the device of FIG. 4A is reduced. The reduction of compressive forces on the inner terminals of the device of FIG. 4A increases the compressive forces on the outer terminals for a force balance to exist. This is the most desirable stress distribution to prevent the fatige of the largest DNP for the device. Another potential factor is a balancing of the forces affecting the center terminals. When the substrate is heated in a thermal cycle, the device 10 expands at a greater rate than the substrate 12. The dielectric material 30 about the periphery of the device resists this expansion of device 10 causing the device to bow upwardly at the center. At the same time, the laminated nature of the device 10 causes it to bow downwardly for the reasons explained previously. Thus these two competing forces have a tendency to cancel each other. Thus the curve 40 is linear which indicates that the C-4 elongation is due only from the shear forces.

Figure 5:
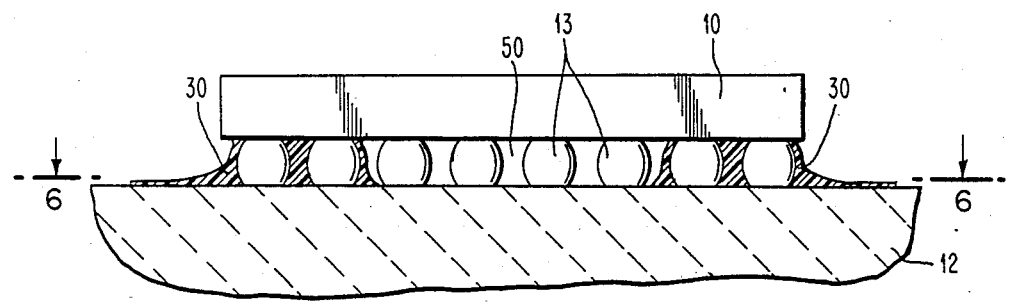
FIG. 5 is an elevational view in greatly enlarged scale of a semiconductor device joined to a substrate by the method of the invention.
Figure 6:
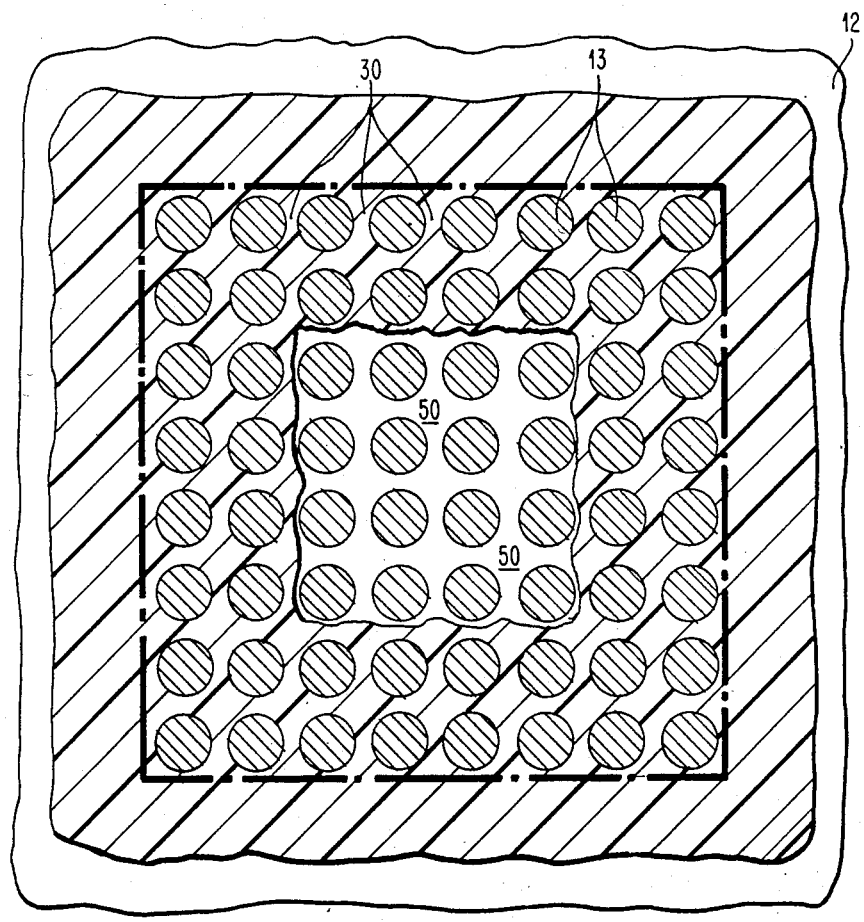
FIG. 6 is a top view of the structure shown in FIG. 5.

FIGS. 5 and 6 indicate a preferred specific embodiment of a device 10 mounted on substrate 12 with dielectric material 30 surrounding and embedding the outer peripheral rows of terminals 13 leaving the center portion 50 free of dielectric material 30. The dielectric material 30 can be of any suitable organic polymerized resin material. In general, the material should have good electrical insulation characteristics, be capable of withstanding relatively high temperatures, have the ability to coat effectively and bond to the C-4 solder terminals, the semiconductor device 10, and the substrate 30, not provide ionic contamination to the device which might cause corrosion, and be resistant to the various solvents used in fabricating semiconductor device packaging. A preferred material for embedding the solder terminals of the device is a resin available commercially and sold under the trademark AI-10 by Amoco Corporation. AI-10 is formed by reacting a diamine such as P,P'diaminodiphenylmethane with trimellitic anhydride or acylchloride of trimelletic anhydride. The polymer is further reacted with gamma-amino propyl triethoxy silane (A1100) or $\beta$-(3,4 - Epoxy cyclohexyl) ethyltrimethoxy silane (A-186). The coating material is described in IBM TDB Sept. 1970 P. 825. The resultant preferred dielectric resin has a density of 1.4 grams per cc, a tensile strength of 13.3 kpsi, an elongation of 2.5%, a compression strength of 23.4 kpsi and a flexural strength of 23.4 kpsi. The dielectric material is applied to the peripheral area of the device by first calculating the amount needed to produce the necessary embedded volume, mixing the resin with a suitable solvent and subsequently dispensing the material along the periphery of the device where it can be drawn in between the device and the substrate by capillary action. The resin is then heated to cause the polymerizing reaction. A preferred formulation for embedding the semiconductor C-4 terminals is formed of AI resin which is a polyimide in an amount of about 8% by weight, in a N-methyl-pyrollidone in an amount of 91.5% with an adhesive promoter in an amount of 0.3-0.4%, available from Union Carbide and sold under the trademark A-1100 or A-186. This preferred dielectric material has a modulus of elasticity of 700 kpsi, and flectural elastic module of 730 kpsi and a coefficient of thermal expansion of $17 \times 10^{-6}$ per degrees F.

Any other dielectric material can be used that will satisfy the requirements discussed previously.

The band of dielectric material can be formed to suit the individual device application to achieve the afore-discussed objective. More specifically the band of material should cover as a minimum a single outer periph-erial row and column of solder terminals, and as a maximum the rows and columns of terminals that lie outside the line where the normal axial displacement of the solder terminals is zero when no dielectric material is present. This line is determined by the locus of points as illustrated in FIG. 2B where the curve 18 crosses the horizontal axis. Stated another way, the band of dielectric material will essentially cover the region of the device where solder bonds are outside the compression zone.

The invention is useful where the center-to-center spacing of the solder terminals grid is from 4 to 20 mils. The spacing between the device and the supporting substrate is in the range of 2 to 10 mils, more preferably in the range of 2 to 4 mils.

The following example is made to illustrate a preferred mode of practicing the invention and is not intended to unduly limit the claims thereof.

EXAMPLE

Three separate sets of substrates, each with a semiconductor device mounted thereon with solder bonds, were prepared. A single chip substrate measuring 28 mm by 28 mm formed with alumina of a coefficient of expansion of $60 \times 10^{-7}$ per degrees C. were used. A silicon semiconductor test substrate measuring 300 mils by 300 mils with a plurality of 29 by 29 solder wettable pads on the bottom surface was selected. Each substrate had a number of pads located 194 mils from the center of the device which represents the worst case distance from the neutral point (DNP). The pads in the footprint had a 5 mil diameter. After the test substrate had been joined to the alumina substrate using conventional techniques, known in the art, the alumina substrates were arranged in three groups. The first group of substrates were to be thermally tested without the addition of any dielectric material to the solder terminals and are generally depicted in FIG. 2A. The second group of substrates were to be thermally tested with dielectric material completely embedding all of the solder terminals, as depicted in FIG. 3A. The third group of substrates were to be thermally tested with only the peripheral solder terminals embedded in dielectric material as shown in FIG. 4A. The dielectric material was estimated to cover approximately 35% of the total area of the pad footprint as a picture frame-like band. Dielectric material to be placed in the second and third group were the same and consisted of AI-10. The following solution was prepared:

| Component | % By Weight |
|---|---|
| Polyamide-imide (Amoco AI-10) | 8 |
| Adhesive Promoter (Union Carbide A110) | .3-.4 |
| Solvent (N—Methyl—Pyrollidone) | 91.5 |

The amount necessary to completely embed the terminals in the silicon test substrate was calculated for group 2 and the volume necessary to only embed the peripheral terminals in group 3 substrates was calculated. In the group 3 silicon test substrates, several outer rows were embedded, which represents about 35% of the total bottom surface area of the silicon test substrate footprint. The calculated volume of the resin was then deposited along the edge of the test substrates, and the devices heated for approximately 20 to 30 minutes at 85° C., and subsequently for 5 hours at 180° C. to cure the resin. All of the alumina substrates were placed in an oven and thermally cycled where the temperature was varied over a temperature excursion of 100° C. The substrates were periodically examined for electrical failures. The first group of substrates without any dielectric material was used as a control group for comparison with the other two groups. The second group of substrates with dielectric material completely embedding all of the solder terminals exhibited a 60% improvement in fatigue life over the bonds. The third group of substrates with the dielectric material embedding only the peripherial solder terminals exhibited a 310% improvement in fatigue life of the bonds. These results indicate a startling improvement which is unexpected from embedding only the outer peripheral solder terminals with a dielectric material.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. An improved solder interconnection for forming I/O connections between an integrated semiconductor device and a support substrate comprising a plurality of solder connections arranged in an area array joining a set of I/O's on a flat surface of said semiconductor device to a corresponding set of solder wettable pads on a substrate, a band of dielectric organic material disposed between and bonded to said device and substrate embedding at least an outer row of solder connections, and leaving the central inner solder connections and the central underside device surface and opposing substrate surface and also the top surface of the device being free of said dielectric organic material.

2. The solder interconnection structure of claim 1 wherein said band of dielectric material covers as a minimum a single outer peripherial row and column, and as a maximum the rows and columns outside the line where the normal axial displacement of the solder terminals is zero when no dielectric material is present.

3. The solder interconnection of claim 1 wherein said band of dielectric organic material is a polyamide-imide polymer.

4. The solder interconnection of claim 1 wherein said band of dielectric material is a polymer formed by reacting P,P'-diaminodiphenylmethane with trimellitic anhydride or acychloride of trimellitic anhydride, and further reacting with gamma-aminopropyl triethoxy silane or β- (3,4-epoxy cyclohexyl) ethyltrimethoxy silane.

5. The solder interconnection of claim 1 wherein said solder interconnections are arranged in columns and rows and are uniformly disposed over the entire face of said device underside surface facing said substrate.

6. The solder interconnection of claim 5 wherein the spacing on a center-to-center basis of said solder interconnection grid is in the range of 4 to 20 mils.

7. The solder interconnection structure of claim 6 wherein said band of dielectric material embeds substantially the region of the device where the solder connections are outside the compression zone.

8. The solder interconnection of claim 1 wherein the spacing between said device and said substrate is in the range of 2 to 10 mils.

9. The solder interconnection of claim 8 wherein the spacing between said device and said substrate is in the range of 2 to 4 mils.

10. The solder interconnection of claim 1 wherein said substrate supports a plurality of devices.

11. The solder interconnection of claim 1 wherein said device is formed of monocrystalline Si and said substrate is formed of alumina.

12. A method of increasing the fatigue life of solder interconnections between a semiconductor device and a supporting substrate comprising: attaching said device to said substrate and
applying a dielectric material exclusively to the peripheral solder connections whereby the connections are embedded leaving the inner connections unembedded, said material adherent to both the device and the substrate whereby said top surface of said device is free of said dielectric material.

13. The method of claim 12 wherein said dielectric material is a polyamide-imide polymer.

14. The method of claim 13 wherein said dielectric material is a polymer formed by reacting P,P' diaminodiphenylmethane with trimellitic anhydride, and further reacting with gamma-aminopropyl triethoxy silane or beta-(3,4-epoxy cyclohexyl) ethyltrimethoxy silane.

15. The method of claim 14 wherein said dielectric material is applied to the solder connections by dispensing a liquid mixture of an organic resin, an adhesion promoter and a solvent along the device peripheral edge and allowing the liquid to be drawn between the device an substrate by surface tension.

* * * * *

UNITED STATES PATENT AND TRADEMARK OFFICE
CERTIFICATE OF CORRECTION

PATENT NO. : 4,604,644

DATED : August 5, 1986

INVENTOR(S) : Keith F. Beckham, Anne E. Kolman, Kathleen M. McGuire, Karl J. Puttlitz, Horatio Quinones It is certified that error appears in the above-indentified patent and that said Letters Patent is hereby corrected as shown below:

On the title page, the last inventor should read;
    Horatio Quinones, Wappingers Falls, New York Signed and Sealed this Twenty-eighth Day of July, 1998

Attest:

BRUCE LEHMAN

Attesting Officer        Commissioner of Patents and Trademarks